United States Patent
Yama et al.

(10) Patent No.: US 10,053,358 B2
(45) Date of Patent: Aug. 21, 2018

(54) MEMS STRUCTURE WITH GRAPHENE COMPONENT

(71) Applicant: Robert Bosch GmbH, Stuttgart (DE)

(72) Inventors: Gary Yama, Mountain View, CA (US); Seow Yeun Yee, Mountain View, CA (US); Franz Laermer, Weil der Stadt (DE); Ashwin Samarao, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/252,637

(22) Filed: Aug. 31, 2016

(65) Prior Publication Data

US 2018/0057351 A1 Mar. 1, 2018

(51) Int. Cl.
*B81B 3/00* (2006.01)
*B81C 1/00* (2006.01)

(52) U.S. Cl.
CPC ........ *B81B 3/0005* (2013.01); *B81C 1/00206* (2013.01); *B81C 1/00984* (2013.01); *B81B 2201/0235* (2013.01); *B81B 2201/0264* (2013.01); *B81B 2203/0315* (2013.01); *B81C 2201/112* (2013.01); *B81C 2203/0136* (2013.01)

(58) Field of Classification Search
CPC .............. B81B 3/0005; B81C 1/00206; B81C 1/00912; B81C 1/0092; B81C 1/00928; B81C 1/00936; B81C 1/00944; B81C 1/00952
See application file for complete search history.

(56) References Cited

U.S. PATENT DOCUMENTS

| | | | | |
|---|---|---|---|---|
| 7,956,428 B2 * | 6/2011 | Yama | .................. | B81C 1/00333 257/415 |
| 8,617,669 B1 * | 12/2013 | Quick | ............... | H01L 21/02381 427/248.1 |
| 2003/0217915 A1 * | 11/2003 | Ouellet | ................. | B22F 1/0051 204/192.15 |
| 2008/0050845 A1 * | 2/2008 | Ulm | ...................... | B81B 3/0005 438/5 |
| 2008/0050861 A1 * | 2/2008 | Vancura | ............... | B81B 3/0005 438/127 |
| 2008/0122020 A1 * | 5/2008 | Metz | ................... | B81C 1/00301 257/415 |
| 2009/0278214 A1 * | 11/2009 | Ulm | ...................... | B81B 3/0005 257/415 |
| 2011/0254020 A1 * | 10/2011 | Yama | .................. | B81C 1/00595 257/77 |
| 2013/0341792 A1 * | 12/2013 | Noda | ................ | H01L 29/66742 257/741 |
| 2014/0043729 A1 * | 2/2014 | Hannah | .................. | H01G 11/28 361/525 |
| 2015/0096376 A1 | 4/2015 | Feyh et al. | | |
| 2015/0098167 A1 * | 4/2015 | El-Kady | ................ | H01G 11/26 361/502 |
| 2015/0381078 A1 | 12/2015 | Massoner | | |

* cited by examiner

*Primary Examiner* — Abul Kalam
(74) *Attorney, Agent, or Firm* — Maginot Moore & Beck LLP

(57) ABSTRACT

A microelectromechanical systems (MEMS) structure includes a substrate, an epitaxial polysilicon cap located above the substrate, a first cavity portion defined between the substrate and the epitaxial polysilicon cap, and a first graphene component having at least one graphene surface immediately adjacent to the first cavity portion.

10 Claims, 4 Drawing Sheets

MEMS STRUCTURE WITH GRAPHENE COMPONENT

FIELD OF THE DISCLOSURE

This disclosure relates to microelectromechanical systems (MEMS) structure.

BACKGROUND

Microelectromechanical systems (MEMS), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

With surface micromachining, a MEMS device structure can be built on a silicon substrate using processes such as chemical vapor deposition. These processes allow MEMS structures to include layer thicknesses of less than a few microns with substantially larger in-plane dimensions. Frequently, these devices include parts which are configured to move with respect to other parts of the device. In this type of device, the movable structure is frequently built upon a sacrificial layer of material. After the movable structure is formed, the movable structure can be released by selective wet etching of the sacrificial layers in aqueous hydrofluoric acid (HF). After etching, the released MEMS device structure can be rinsed in deionized water to remove the etchant and etch products.

Due to the large surface area-to-volume ratio of many movable structures, a MEMS device including such a structure is susceptible to interlayer or layer-to-substrate adhesion during the release process (release adhesion) or subsequent device use (in-use adhesion). This adhesion phenomenon is more generally called stiction. Stiction is exacerbated by the ready formation of a 5-30 angstrom thick native oxide layer on the silicon surface, either during post-release processing of the MEMS device or during subsequent exposure to air during use. Silicon oxide is hydrophilic, encouraging the formation of water layers on the native oxide surfaces that can exhibit strong capillary forces when the small interlayer gaps are exposed to a high humidity environment. Furthermore, Van der Waals forces, due to the presence of certain organic residues, hydrogen bonding, and electrostatic forces, also contribute to the interlayer attraction. These cohesive forces can be strong enough to pull the free-standing released layers into contact with another structure, causing irreversible latching and rendering the MEMS device inoperative.

Various approaches have been used in attempts to minimize adhesion in MEMS devices. These approaches include drying techniques, such as freeze-sublimation and supercritical carbon dioxide drying, which are intended to prevent liquid formation during the release process, thereby preventing capillary collapse and release adhesion. Vapor phase HF etching is commonly used to alleviate in-process stiction. Other approaches are directed to reducing stiction by minimizing contact surface areas, designing MEMS device structures that are stiff in the out-of-plane direction, and hermetic packaging.

An approach to reducing in-use stiction and adhesion issues is based upon surface modification of the device by addition of an anti-stiction coating. The modified surface ideally exhibits low surface energy by adding a coating of material, thereby inhibiting in-use adhesion in released MEMS devices. Most coating processes have the goal of producing a thin surface layer bound to the native silicon oxide that presents a hydrophobic surface to the environment. In particular, coating the MEMS device surface with self-assembled monolayers (SAMs) having a hydrophobic tail group has been shown to be effective in reducing in-use adhesion. SAMs have typically involved the deposition of organosilane coupling agents, such as octadecyltrichlorosilane and perfluorodecyltrichlorosilane, from nonaqueous solutions after the MEMS device is released. Even without anti-stiction coating, native oxide generation occurs on silicon surfaces.

In spite of these various approaches, in-use adhesion remains a serious reliability problem with MEMS devices. One aspect of the problem is that even when an antistiction coating is applied, the underlying silicon layer may retain various charges. For example, silicon by itself is not a conductor. In order to modify a silicon structure to be conductive, a substance is doped into the silicon. The realizable doping-level is limited, however, due to induced stress in the functional silicon layer. Accordingly, during manufacturing process, charges are deposited on the silicon surfaces of sensing elements and the charges do not immediately migrate. The charges include dangling bonds due to trench forming processes used to define various structures. In capacitive sensing devices those charges may cause a reliability issue since they are not all locally bound. Some charges have a certain mobility and may drift as a function of temperature or aging. This can lead to undesired drift effects, e. g. of the sensitivity or offset of the capacitive sensor. Therefore, a highly conductive working layer (not possible w/silicon) or at least a highly conductive coating on top of the structures in order to not accumulate surface charges would be desirable.

Moreover, the limited conductivity of silicon may result in unacceptable RC time constants in electronic evaluation circuits including capacitive sensors. A sensor element with, e. g., a 10 pF total capacitance (C) and 10 kOhm total resistance (R) may be limited to operation below frequencies of about 1 MHz. Operation at higher frequencies is desired in certain applications, however, since higher frequency operation may lead to a better signal to noise performance of the sensor. Therefore, increased conductivity in MEMS devices which enable achievement of lower RC time constants would be beneficial.

Thus, there remains a need for a reliable structure for MEMS devices that is compatible with MEMS fabrication processes that can be used to reduce stiction forces, surface charges, and/or the resistivity of MEMS structures.

SUMMARY

In accordance with one embodiment of the disclosure, there is provided a microelectromechanical systems (MEMS) structure including a substrate, an epitaxial polysilicon cap located above the substrate, a first cavity portion defined between the substrate and the epitaxial polysilicon cap, and a first graphene component having at least one graphene surface immediately adjacent to the first cavity portion.

In one or more embodiments, the first cavity portion extends vertically within the MEMS structure, and the at least one graphene surface includes a vertically extending wall defining a vertical wall of the first cavity portion.

In one or more embodiments a MEMS structure includes a second horizontally extending cavity portion opening to the first cavity portion, and a second graphene component defining a lower portion of the second horizontally extending cavity portion.

In one or more embodiments, the at least one graphene surface is a scalloped vertically extending wall.

In one or more embodiments a first surface of the at least one graphene surfaces is immediately beneath the first cavity portion, and a second surface of the at least one graphene surfaces is immediately above a second cavity portion.

In one or more embodiments, the first graphene component is movable within a cavity including the first cavity portion and the second cavity portion.

In accordance with one embodiment of the disclosure a method of forming a microelectromechanical systems (MEMS) structure includes providing a substrate, forming a first portion of an epitaxial polysilicon cap above the substrate, forming a first cavity portion above the substrate by vapor release through at least one vent extending through the first portion of the epitaxial polysilicon cap, converting a silicon carbide portion immediately adjacent to the first cavity portion to graphene using a hydrogen bake, and sealing the at least one vent with a second portion of the epitaxial polysilicon cap after converting the silicon carbide portion.

In accordance with one or more embodiments, providing the substrate comprises providing a silicon on insulator (SOI) wafer, forming the first cavity portion comprises exposing a silicon portion of the SOI wafer immediately adjacent to the first cavity portion, and the method further comprises conformally depositing the silicon dioxide portion on the exposed silicon portion.

In accordance with one or more embodiments, forming the first cavity portion includes deep reactive ion etching a trench completely through a silicon layer of the SOI wafer, filling the trench with a sacrificial oxide portion after conformally depositing the silicon dioxide portion, and using a hydrofluoric acid vapor to expose the silicon dioxide portion.

In accordance with one or more embodiments, conformally depositing the silicon dioxide portion includes conformally depositing the silicon dioxide portion on a scalloped surface of the exposed silicon portion, and converting the silicon carbide portion comprises converting the silicon carbide portion to a scalloped graphene portion.

In accordance with one or more embodiments, the hydrogen bake is conducted in an epitaxial reactor, and the second portion of the epitaxial polysilicon cap is deposited in the epitaxial reactor.

In accordance with one or more embodiments, providing the substrate comprises providing a silicon carbide layer on an insulator layer, and the silicon carbide portion is a portion of the silicon carbide layer.

In accordance with one or more embodiments, forming the first cavity portion includes deep reactive ion etching a trench completely through the silicon carbide layer, filling the trench with a sacrificial oxide portion, and using a hydrofluoric acid vapor to expose the portion of the silicon carbide layer.

In accordance with one or more embodiments, converting the silicon carbide portion comprises completely converting the segment of the silicon carbide layer to graphene.

In accordance with one or more embodiments, forming the first cavity portion comprises releasing a segment of the silicon carbide layer.

DESCRIPTION

Figure 1:
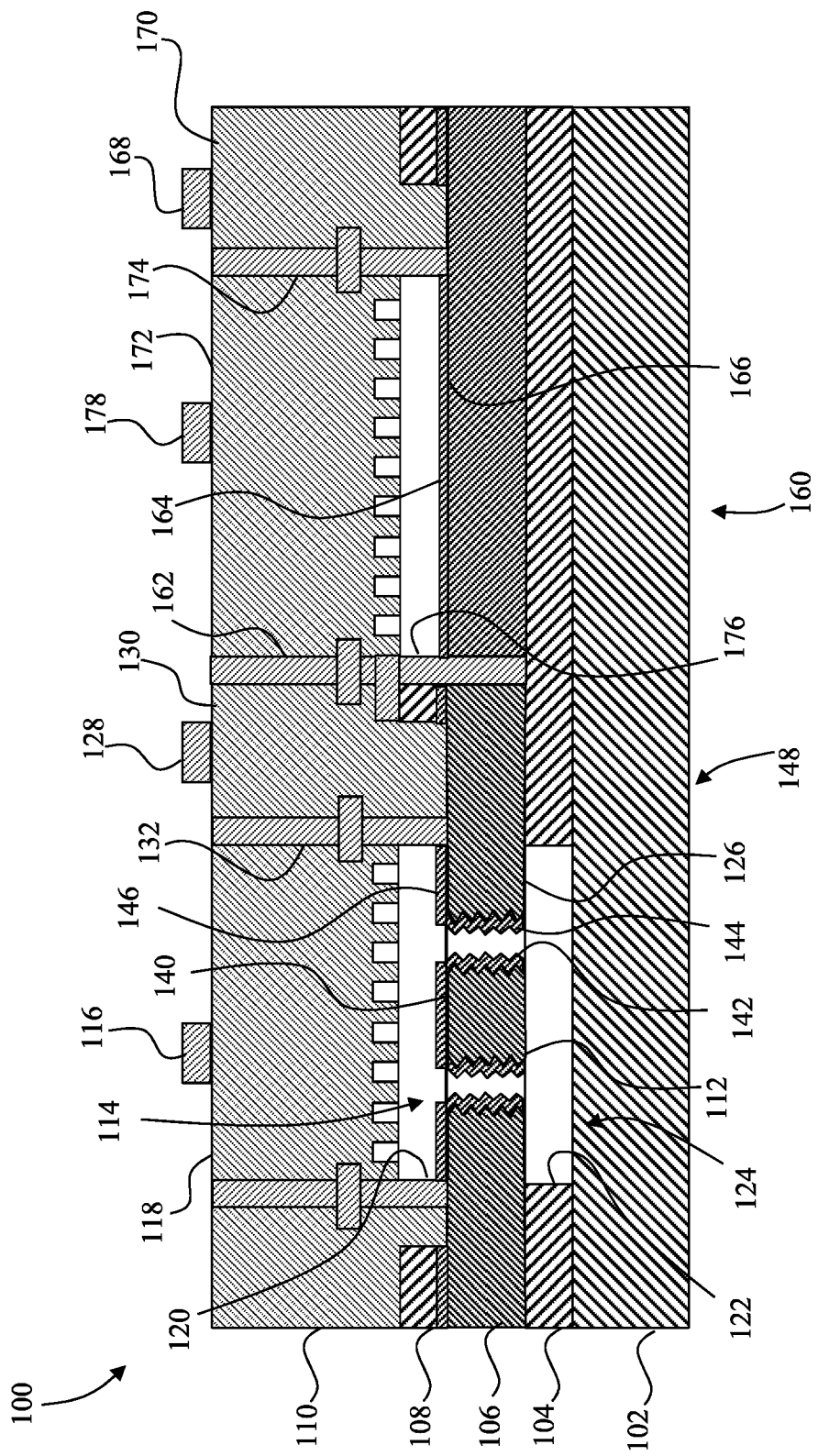
FIG. 1 depicts a cross sectional view of a simplified MEMS structure including a motion detector and a pressure detector incorporating graphene components.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

FIG. 1 depicts a simplified MEMS structure 100. The MEMS structure 100 in this embodiment is depicted as a silicon on insulator (SOI) wafer including a substrate in the form of a silicon handle layer 102, a buried silicon oxide layer 104, and a silicon device layer 106. Above the device layer 106 is a second buried silicon oxide layer 108 and an epitaxial polysilicon cap layer 110.

Within the device layer 106 a working component 112 is defined by a trench 114. The working component 112 is connected to a contact 116 through a connector 118. The trench 114 extends vertically completely through the device layer 106 and connects an upper cavity portion 120 and a lower cavity portion 122 to form a cavity 124. An electrode 126 is spaced apart from the working component 112 and connected to a contact 128 through a connector 130. The connector 130 is electrically isolated from the connector 118 by a spacer 132.

The electrode 126 and working component 112 are at least partially coated with graphene. A horizontally extending graphene portion 140 extends across the upper surface of the working component 112 immediately adjacent to the upper cavity portion 120 and vertically extending graphene walls 142/144 extend along and immediately adjacent to the trench 114. A second horizontally extending graphene portion 146 extends along the upper surface of the electrode 126 immediately adjacent to the upper cavity portion 120.

The graphene portions 140/142/144/146 provide reduced resistance and reduced possibility for stiction. Specifically, graphene is an allotrope of carbon wherein every carbon atom is bonded to three other carbon atoms in plane and bonded to a hydrogen atom perpendicular to the plane. Graphene exhibits high electrical conductivity, high electron mobility, high sustainable currents, low mechanical friction, high light transmission, and high thermal conductivity. Graphene is thus desirable in applications wherein reduced electrical resistance is desired. Graphene also has a very low surface energy due to very weak Van der Waals forces and as a result is a very good anti-stiction layer.

Returning to FIG. 1, the electrode 126 and working component 112 are part of an in-plane motion sensor 148. The MEMS structure 100 in this embodiment further includes a pressure sensor 160. The pressure sensor 160 is electrically separated from the in-plane motion sensor 148 by a spacer 162. The pressure sensor 160 includes a lower electrode 164 in the form of a horizontally extending graphene portion 166. The horizontally extending graphene portion 166 is electrically connected to a contact 168 through a connector 170 which extends through the epitaxial polysilicon cap layer 110. An upper electrode 172 is defined in the epitaxial polysilicon cap layer 110 by the spacer 162 and a spacer 174. The upper electrode 172 is spaced apart from the lower electrode 164 by a cavity 176 immediately adjacent to the graphene portion 166. A contact 178 is provided for the upper electrode 172.

Figure 2:
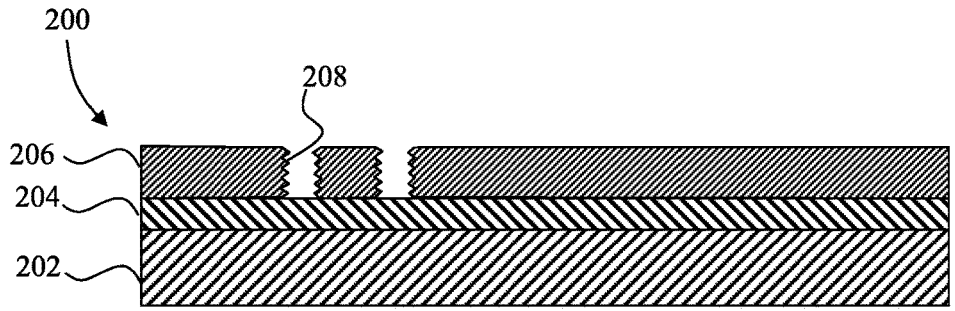
FIG. 2 depicts a cross sectional view of a silicon on insulator (SOI) wafer used in accordance with one embodiment to form a MEMS structure incorporating graphene, such as the MEMS structure of FIG. 1, with trenches formed by a DRIE process.

The incorporation of graphene into the MEMS structure 100 is easily accomplished without excessive modification of known manufacturing techniques and processes. By way of example FIG. 2 depicts an SOI wafer 200 that is used in one embodiment to form the MEMS structure 100. The SOI wafer includes a substrate layer 202, a buried oxide layer 204, and a device layer 206. In some embodiments, the layers 204 and 206 are formed during a manufacturing process of the MEMS structure while in some embodiments the SOI wafer 200 is previously formed. As depicted in FIG. 2, trench 208 is then etched completely through the device layer using a deep reactive ion etch process. This process results in scalloped edges of the trench 208.

Figure 3:
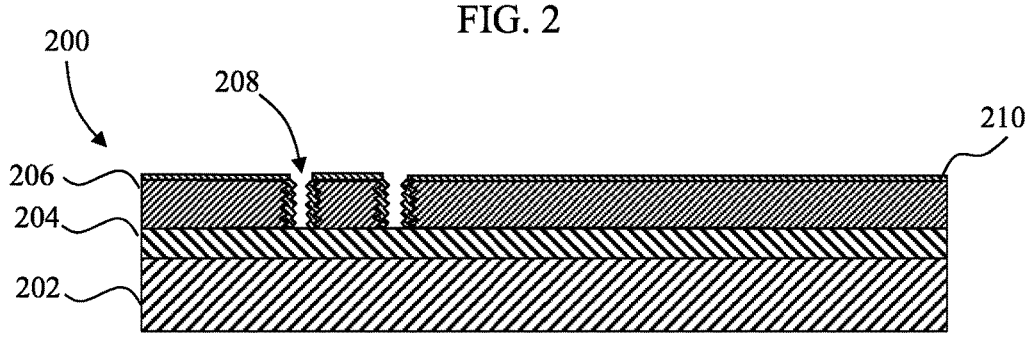
FIG. 3 depicts a cross sectional view of the SOI wafer of FIG. 2 after silicon carbide has been conformally deposited on exposed silicon surfaces.

Turning to FIG. 3, a silicon carbide layer 210 is formed on the exposed surfaces by conformal deposition of silicon carbide. Deposition of silicon carbide may be accomplished using any desired conformal deposition process such as LPCVD, PECVD, ALD, epitaxial deposition, etc.

An oxide layer 212 (FIG. 4) is then deposited on the upper surface of the silicon carbide layer 210. The oxide layer also fills the trench 208 with segment 214. A trench is then formed through the silicon carbide layer and the device layer 206 and a silicon nitride layer is deposited and patterned to fill the trench with a silicon nitride spacer portion 212.

Figure 4:
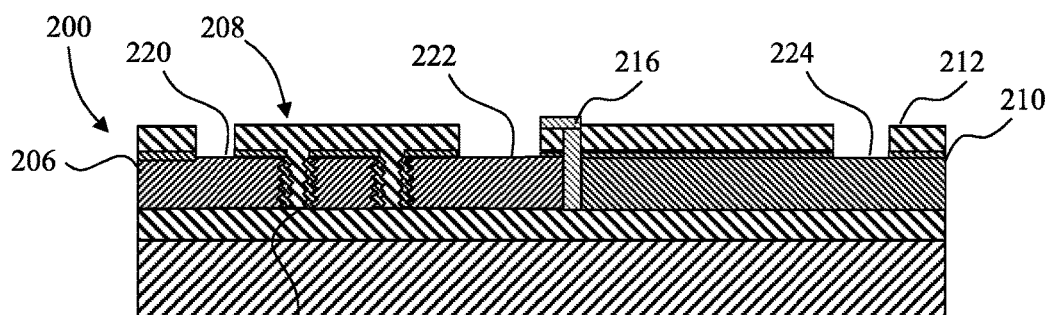
FIG. 4 depicts a cross sectional view of the SOI wafer of FIG. 3 after a sacrificial oxide layer has been formed and patterned and a portion of a nitride spacer has been formed.

The oxide layer 214 and the silicon carbide layer 212 are then patterned and etched resulting in the configuration of FIG. 4 wherein portions 220, 222, and 224 of the device layer 206 are exposed. The upper surface of the silicon nitride spacer portion 212 is also exposed.

Figure 5:
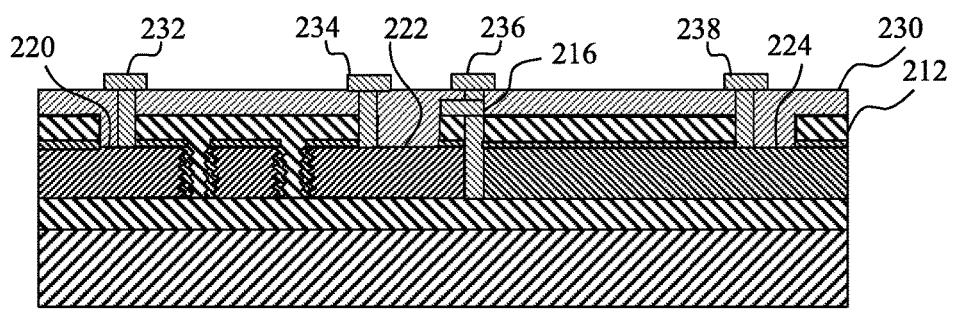
FIG. 5 depicts a cross sectional view of the structure of FIG. 4 after a first portion of an epitaxial polysilicon cap and additional nitride spacer portions have been formed.
Figure 6:
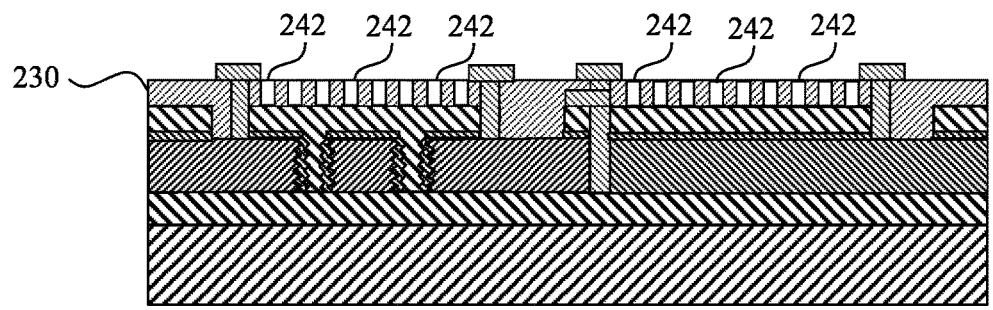
FIG. 6 depicts a cross sectional view of the structure of FIG. 5 after vent holes have been etched in the first portion of an epitaxial polysilicon cap.

A first portion 230 of an epitaxial polysilicon cap is then formed on the upper surface of the remaining oxide layer 212, the nitride spacer portion 216, and the portions 220, 222, and 224 (FIG. 5). The first portion 230 is then trenched and a second silicon nitride layer is deposited and patterned resulting in silicon nitride spacer portions 232, 234, 236, and 238. Vent holes 242 are formed through the first portion 230 of the epitaxial polysilicon cap (FIG. 6). A hydrofluoric acid is then used to vapor etch all of the exposed oxide portions through the vent holes 242 resulting in the configuration of FIG. 7.

Figure 7:
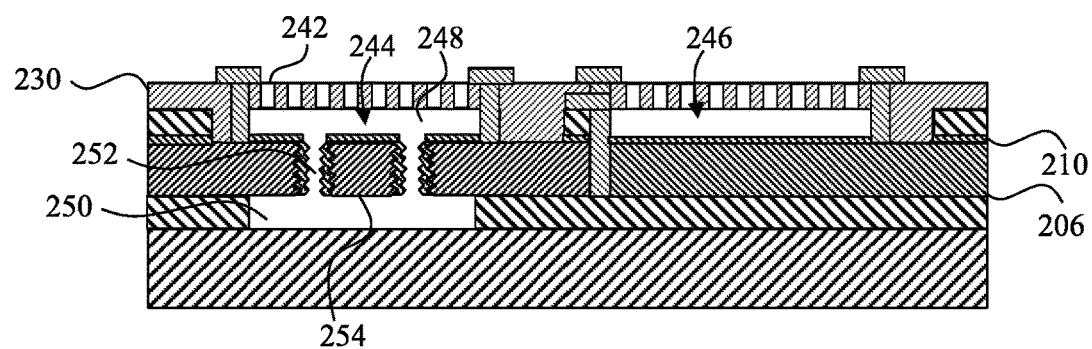
FIG. 7 depicts a cross sectional view of the structure of FIG. 6 after oxide portions have been etched to form cavities and to release a working structure in the device layer.

In FIG. 7, cavities 244 and 246 have been formed exposing portions of the silicon carbide layer 210. The cavity 244 includes an upper cavity portion 248 and a lower cavity portion 250 which are joined by a trench portion 252. A segment 254 of the device layer 206 is thus released from the remainder of the device layer 206 with the exception of an anchor portion (not shown).

The structure is now subjected to a hydrogen bake. The hydrogen bake is conducted in an epitaxial reactor. The temperature is controlled to be above 1050° C., and preferably between 1050° C. and 1300° C. At this temperature, all of the organic and other impurities from the cavities including any native silicon dioxide are removed resulting in a very clean environment.

Figure 8:
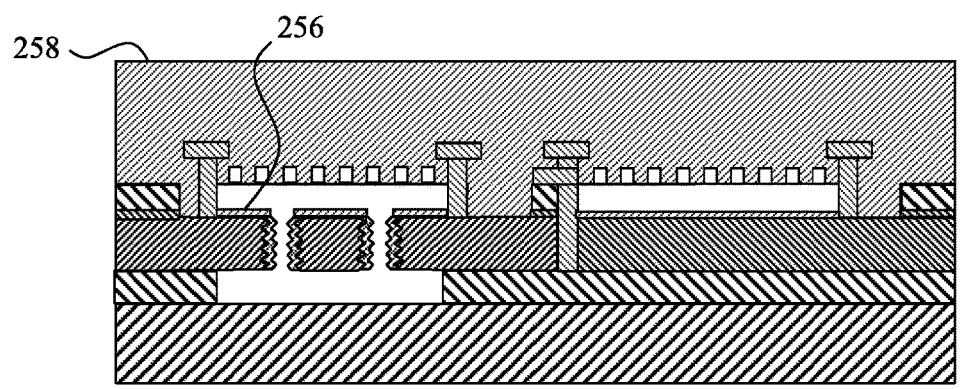
FIG. 8 depicts a side cross sectional view of the structure of FIG. 7 after a second portion of an epitaxial polysilicon cap has been formed closing off the vents.

The high temperature of the hydrogen bake also sublimates silicon from the exposed silicon carbide layer thereby precipitating layers of graphene beginning at the outer surface. A sufficiently long bake will convert the entire layer of silicon carbide 210 to graphene 256 as depicted in FIG. 8.

Advantageously, the silicon carbide protects the underlying silicon from the bake. Specifically, the DRIE process creates a scalloped surface. In a normal bake, the silicon reflows resulting in a smooth vertical wall surface and smooth surfaces increase the potential for stiction issues. In contrast, the formation of graphene from silicon dioxide prevents the underlying silicon from reflowing. Accordingly, the graphene is formed with a scalloped surface which reduces the potential for stiction. Additionally, the graphene surface increases the efficiency of electrostatic transduction in the MEMS structure by several orders of magnitude.

Once the hydrogen bake has been maintained for the desired amount of time, an epitaxial polysilicon cap portion 258 is formed using the same epitaxial reactor used to form the graphene. This hermetically seals the MEMS structure in a pure, high vacuum environment typically of about 1-10 Pascals. This assists in keeping the graphene pristine to optimize the quantum, electronic, and thermal properties of the graphene since graphene is easily contaminated.

Once the MEMS structure is sealed, electrical isolation spaces and electrical contacts are formed as desired resulting in the configuration of the MEMS structure 100 in FIG. 1. While the process for forming an in-plane sensor along with a pressure sensor has been discussed above, other embodiments form only a single sensor or device within the MEMS structure. Such methods will typically reduce the number of process steps. Additionally, the above described method can be easily modified to provide other types of sensors and other combinations of sensors. Such sensors include in-plane accelerometers, gyroscopes, out-of-plane accelerometers, combined in-plane/out-of-plane accelerometers, pressure sensors, microphones, resonating structures, magnetic field sensors, angular rate sensors etc.

Figure 9:
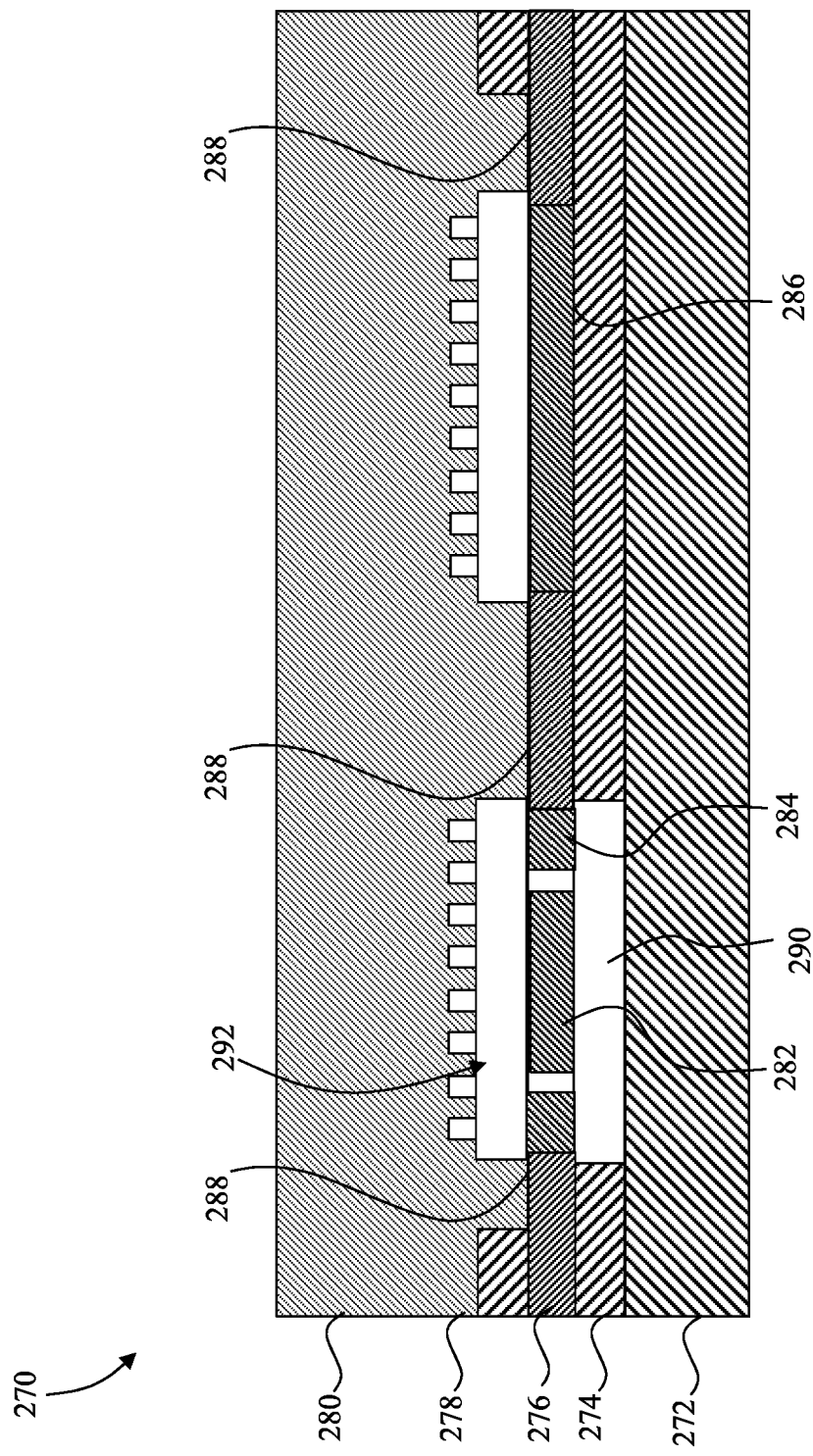
FIG. 9 depicts a side cross sectional view of a MEMS structure formed using a silicon carbide on insulator wafer which allows simplification of the process of FIGS. 2-8 and which can provide a solid graphene working structure and electrodes.

Additionally, while the description above provided silicon dioxide by way of a conformal coating on silicon, the silicon dioxide can be provided in other ways. By way of example, FIG. 9 depicts a simplified depiction of a MEMS structure 270 which includes a substrate layer 272, a buried oxide layer 274, a device layer 276, an oxide layer 278, and an epitaxial polysilicon cap 280. The MEMS structure 270 differs from the MEMS structure 100 primarily in that the device layer 276 is provided as a monolithic silicon dioxide layer directly positioned on the buried oxide layer 274.

Accordingly, once subjected to a hydrogen bake as described above, the working portion 282 and electrodes 284/286 of the device layer 276 have been completely converted to graphene using a modified form of the process described above while portions 288 of the device layer 276 remain silicon dioxide. Accordingly, the graphene working portion 282 is immediately above a lower portion 290 of a cavity 292. Thus, forming the cavity 292 results in release of the graphene working portion 282.

Consequently, by using a silicon carbide on insulator wafer a suspended all-graphene device (MEMS or otherwise) can be realized. This allows for the manufacture of graphene membranes for pressure sensors, microphones etc., and even resonating microstructures using the process described above. The structures can further be used in electronic and photonic devices.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a microelectromechanical systems (MEMS) structure, comprising:
   providing a substrate;
   forming a first portion of an epitaxial polysilicon cap above the substrate;
   forming a first cavity portion above the substrate by vapor release through at least one vent extending through the first portion of the epitaxial polysilicon cap;
   converting a silicon carbide portion immediately adjacent to the first cavity portion to graphene using a hydrogen bake; and
   sealing the at least one vent with a second portion of the epitaxial polysilicon cap after converting the silicon carbide portion.

2. The method of claim 1, wherein:
   providing the substrate comprises providing a silicon on insulator (SOI) wafer; and
   the method further comprises, prior to forming the first portion of the epitaxial polysilicon cap:
     trenching the SOI wafer to expose a silicon portion of the SOI wafer; and
     conformally depositing the silicon carbide portion on the exposed silicon portion.

3. The method of claim 2, wherein trenching the SOI wafer comprises:
   deep reactive ion etching a trench completely through a silicon layer of the SOI wafer, the method further comprising
   filling the trench with a sacrificial oxide portion after conformally depositing the silicon carbide portion, wherein forming the first cavity portion comprises:
   using a hydrofluoric acid vapor to expose the silicon carbide portion.

4. The method of claim 3, wherein:
   conformally depositing the silicon carbide portion comprises conformally depositing the silicon carbide portion on a scalloped surface of the exposed silicon portion; and
   converting the silicon carbide portion immediately adjacent to the first cavity portion to graphene using the hydrogen bake further comprises converting the silicon carbide portion to a scalloped graphene portion.

5. The method of claim 2, wherein:
   the hydrogen bake is conducted in an epitaxial reactor; and
   the second portion of the epitaxial polysilicon cap is deposited in the epitaxial reactor.

6. The method of claim 1, wherein:
   providing the substrate comprises providing a silicon carbide layer on an insulator layer; and
   the silicon carbide portion is a portion of the silicon carbide layer.

7. The method of claim 6, further comprising, prior to forming the first portion of the epitaxial polysilicon cap:
   deep reactive ion etching a trench completely through the silicon carbide layer to expose the silicon carbide portion; and
   filling the trench with a sacrificial oxide portion, wherein forming the first cavity portion above the substrate by vapor release through the at least one vent extending through the first portion of the epitaxial polysilicon cap further comprises:
   using a hydrofluoric acid vapor to re-expose the silicon carbide portion.

8. The method of claim 7, wherein:
   converting the silicon carbide portion immediately adjacent to the first cavity portion to graphene using the hydrogen bake further comprises completely converting the silicon carbide layer to graphene.

9. The method of claim 8 wherein forming the first cavity portion further comprises releasing a segment of the silicon carbide layer.

10. The method of claim 8, wherein:
    the hydrogen bake is conducted in an epitaxial reactor; and
    the second portion of the epitaxial polysilicon cap is deposited in the epitaxial reactor.

* * * * *